US011226212B2

(12) United States Patent
Roziere et al.

(10) Patent No.: US 11,226,212 B2
(45) Date of Patent: Jan. 18, 2022

(54) ROBOT EQUIPPED WITH CAPACITIVE DETECTION

(71) Applicant: FOGALE NANOTECH, Nîmes (FR)

(72) Inventors: Didier Roziere, Nîmes (FR); Frédéric Ossart, Langlade (FR)

(73) Assignee: FOGALE NANOTECH, Nîmes (FR)

( * ) Notice: Subject to any disclaimer, the term of this patent is extended or adjusted under 35 U.S.C. 154(b) by 157 days.

(21) Appl. No.: 16/612,702

(22) PCT Filed: May 7, 2018

(86) PCT No.: PCT/EP2018/061678
§ 371 (c)(1),
(2) Date: Nov. 11, 2019

(87) PCT Pub. No.: WO2018/210600
PCT Pub. Date: Nov. 22, 2018

(65) Prior Publication Data
US 2021/0080293 A1    Mar. 18, 2021

(30) Foreign Application Priority Data

May 15, 2017 (FR) ........................ 1754244

(51) Int. Cl.
*G01D 5/24* (2006.01)
*B25J 15/00* (2006.01)
(Continued)

(52) U.S. Cl.
CPC ............ *G01D 5/2405* (2013.01); *B25J 15/00* (2013.01); *B25J 19/027* (2013.01); *B25J 19/06* (2013.01); *G01R 27/2605* (2013.01)

(58) Field of Classification Search
CPC .. G01D 5/00; G01D 5/12; G01D 5/14; G01D 5/24; G01D 5/2405; G01R 27/00;
(Continued)

(56) References Cited

U.S. PATENT DOCUMENTS 7,242,323 B2 * 7/2007 Sato .................. G01D 5/24
  307/651
8,918,213 B2 * 12/2014 Rosenstein .......... G05D 1/0227
  700/258
(Continued)

FOREIGN PATENT DOCUMENTS

DE   102013021387 A1   6/2015
DE   202016004237 U1   8/2016
EP       3166228 A1    5/2017

OTHER PUBLICATIONS

French Search Report from French Patent Application No. 1754244, dated Jan. 23, 2018.
(Continued)

*Primary Examiner* — Hoai-An D. Nguyen
(74) *Attorney, Agent, or Firm* — Greer, Burns & Crain, Ltd.

(57) ABSTRACT

A robot includes a body on which is mounted a functional head also including a capacitive detector, including:
  at least one electrical insulator in order to electrically insulate the functional head;
  at least one apparatus for electrically polarizing the functional head at a first alternating electrical potential ($V_g$), different from a ground potential;
  at least one guard polarized at an alternating guard potential ($V_G$) identical to the first alternating electrical potential; and
  at least one electronics, called detection electronics, for measuring a signal relating to a coupling capacitance, called electrode-object capacitance, between the sensitive part and a surrounding object.

16 Claims, 4 Drawing Sheets

(51) Int. Cl.
 *B25J 19/02* (2006.01)
 *B25J 19/06* (2006.01)
 *G01R 27/26* (2006.01)

(58) Field of Classification Search
 CPC .... G01R 27/02; G01R 27/26; G01R 27/2605; G05B 19/00; G05B 19/02; G05B 19/18; G05B 19/406; G05B 19/4061; G05B 2219/37272; G05B 2219/37284; G05B 2219/39082; H03K 17/00; H03K 17/94; H03K 17/945; H03K 17/955; H03K 2217/96073; H03K 2217/960765; B25J 15/00; B25J 15/02; B25J 13/00; B25J 13/08; B25J 13/086; B25J 9/00; B25J 9/16; B25J 9/1674; B25J 9/1676; B25J 19/00; B25J 19/02; B25J 19/027; B25J 19/06

USPC ................ 324/600, 649, 658, 661, 663, 671
 See application file for complete search history.

(56) References Cited

U.S. PATENT DOCUMENTS

2007/0192910 A1* 8/2007 Vu .......................... B25J 19/06
  700/245
2017/0173791 A1* 6/2017 Dalibard ................ B25J 9/1697
2017/0225336 A1* 8/2017 Deyle .................. G08B 13/196

OTHER PUBLICATIONS

International Search Report from International Patent Application No. PCT/EP2018/061678, dated Aug. 28, 2018.

* cited by examiner

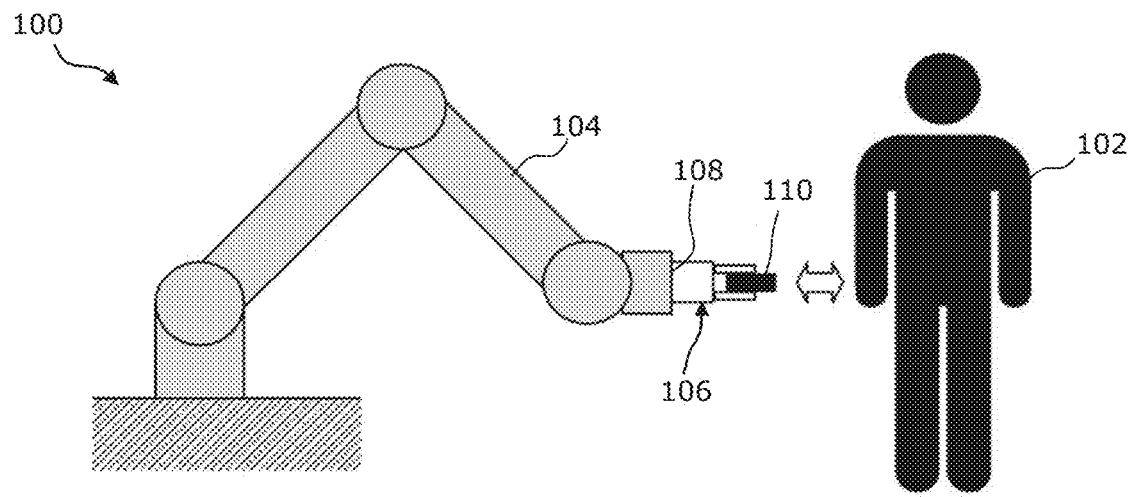
FIG. 1 : PRIOR ART
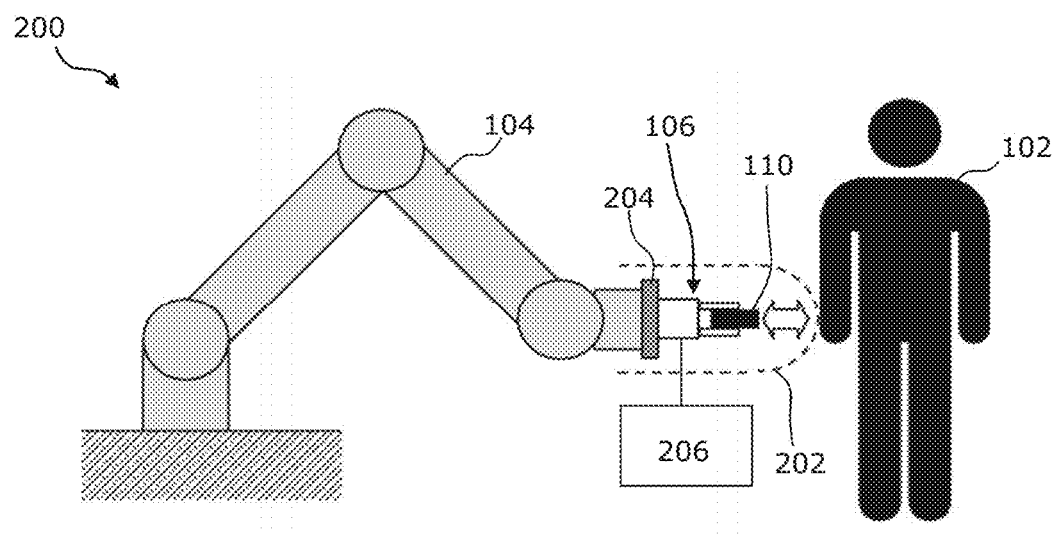
FIG. 2

ROBOT EQUIPPED WITH CAPACITIVE DETECTION

BACKGROUND

The present invention relates to a robot comprising a body and a functional head, said functional head being capable of carrying out capacitive detection of surrounding objects. It also relates to a device forming such a functional head for robots.

The field of the invention is, non-limitatively, that of the field of robotics, in particular in the field of industrial robotics or service robots, for example medical or domestic robots.

Industrial or domestic robots, in particular collaborative robots, generally comprise a body on which a functional head is fastened, presented in the form of a tool or a tool-holder, allowing them to carry out one or more tasks in an environment.

These robots are involved in more and more applications, completely autonomously or assisting a person or an operator. It is necessary to equip these robots with detection means in order to improve safety, collaboration and interaction with humans and surrounding objects, regardless of the field: industrial, medical, domestic, service, etc.

However, the functional heads found on an extremity of a robot, in particular a collaborative robot, are often complex in shape. It is very difficult, time consuming and impractical to fasten proximity sensors or sensitive surface elements thereto. For example, grippers with several articulations and a large number of small mechanical parts having a wide range of movement (such as for example digits) are found, which leave little space for the fastening of sensors or sensitive surfaces. In addition, the complexity of integrating the sensitive surface would make this solution very expensive and not very robust.

A purpose of the present invention is to overcome at least one of these drawbacks.

Another purpose of the present invention is to equip a robot with a function for capacitive detection of surrounding objects and persons in a simple, inexpensive, manner that is robust and not very time consuming.

Another purpose of the present invention is to propose a capacitive detection function that can be added, with few modifications, to existing robots which were not initially designed with such a function.

SUMMARY

At least one of these purposes is achieved with a robot comprising a body on which is mounted, in particular in a removable or detachable, or even interchangeable manner, a functional head forming a tool, or a tool-holder, said robot also comprising capacitive detection means comprising:
- at least one electrical insulator in order to electrically insulate at least one part, called sensitive part, of said functional head from the rest of said robot;
- at least one means for electrically polarizing said sensitive part by a first alternating electrical potential ($V_g$), different from a ground potential (M),
- at least one guard polarized at a second alternating potential ($V_G$), called guard potential, identical or substantially identical to the first alternating electrical potential ($V_G$) at a given working frequency, in order to electrically guard said sensitive part, and
- at least one electronics, called detection electronics, for measuring a signal with relating to a coupling capacitance ($C_{eo}$), called electrode-object capacitance, between said sensitive part and a surrounding object.

Thus, the invention proposes a robot in which at least one part, called sensitive part, of the functional head is used in order to carry out capacitive detection, without adding capacitive electrodes.

In fact, the functional head is used, partially or totally, as a capacitive electrode in order to carry out capacitive detection of approach or contact with a surrounding object or person. The coupling capacitance generated by the functional head, and in particular by the tool or the tool-holder, of the robot according to the invention, and measured by the capacitive electronics, corresponds to the capacitance created between the environment and the functional head. Under these conditions, it becomes possible to easily detect the approach and the contact of an object or a human with the tool.

Thus, the invention makes it possible to equip a robot with a function for capacitive detection of approach and contact, without having to equip this robot, and in particular its functional head, with capacitive electrodes. Such a solution is simple, inexpensive, robust and not very time consuming. In addition, such a solution can be applied, with few modifications, to an existing robot which was not initially designed with such a detection function.

Moreover, when the robot is intended to use interchangeable functional heads, the proposed solution makes it possible to carry out an intervention on these functional heads in an independent manner, without carrying out an intervention on the rest of the robot.

Moreover, another advantage of the present invention is the possibility of using an object borne by the functional head, such as the extension of the functional head used as electrode. In fact, the close contact between the functional head and the carried object creates a significant capacitive coupling between them. The functional head and the object that it carries naturally find themselves at a similar electrical potential. The carried object does not need to be a good conductor of electricity in order to behave as the extension of the functional head in terms of capacitive detection. A dielectric of a plastic or polymer material the dielectric permittivity of which is for example greater than 3 is sufficient to become the extension of the functional head. The carried object then forms part of the sensitive functional head.

The functional head can comprise several separate sensitive parts used as separate capacitive electrodes, and polled sequentially or in parallel by the detection electronics. Insofar as these sensitive parts are polarized at one and the same alternating electrical potential ($V_g$) at a working frequency, they constitute guard elements for the others respectively and thus do not experience interference.

These separate sensitive parts can be for example the digits of a gripping tool.

In the present application, by "object" is meant any object or person that may be located within the environment of the robot.

In the present application, two alternating potentials are identical at a given frequency when they each comprise an alternating component that is identical at this frequency. Thus, the at least one of the two identical potentials at said frequency can also comprise a direct component, and/or an alternating component having a frequency different from said given frequency.

Similarly, two alternating potentials are different at the working frequency when they do not comprise an alternating component that is identical at this working frequency.

In the present application, for the sake of brevity, the term "ground potential" or "general ground potential" denotes a reference potential of the electronics or of the robot, which can be for example an electrical earth or a ground potential. This ground potential can correspond to an earth potential or to another potential, connected or not to the earth potential.

Furthermore it is noted that generally, objects which are not in direct electrical contact with a particular electrical potential (electrically floating objects) tend to polarize by capacitive coupling at the electrical potential of other objects present in their environment, such as for example ground or electrodes, if the surface areas of overlap between these objects and those of the environment (or the electrodes) are sufficiently large.

The electrical polarization means can advantageously comprise an oscillator which generates an alternating excitation voltage in order to polarize the sensitive part at the first alternating electrical potential.

This alternating excitation voltage can also be used as a guard potential in order to polarize the at least one guard.

The robot according to the invention can comprise a mechanical interface, articulated or not, between the functional head and the body.

According to a particular embodiment, an insulator, respectively a guard, can be arranged at the level of said mechanical interface.

The functional head can comprise a sensitive part formed by the totality of said functional head.

In this case, when the functional head is a tool-holder, respectively a tool, it is the totality of the tool-holder, respectively the totality of the tool, which is then used as capacitive detection electrode.

The insulator can be arranged on the side of the functional head, or on the side of the body of the robot.

The guard can be arranged on the side of the functional head, or on the side of the body of the robot.

According to an alternative embodiment, only a part of the functional head may be sensitive. In this case, the insulator and the guard can be arranged in said tool head, at a distance from the mechanical interface.

According to an alternative embodiment, the functional head can comprise several sensitive parts. In this case it can also comprise insulators or insulating parts separating these sensitive parts.

The sensitive part of the functional head, or the functional head, can comprise at least one electrical component part, such as a sensor, an actuator, a motor and/or associated electronics (signal conditioner, driver).

Such an electrical component part can comprise, or be associated with, electric wires, which carry input/output signals to/from said electrical component part.

For example, the functional head can use, or be equipped with, a gripper. This is generally managed by the robot via two power supply cables and two serial communication cables for the controls and the return of information.

Now, by default, these electrical component parts are referenced to the general ground potential, and thus risk being detected by the sensitive part of the functional head used as a capacitive electrode.

According to a first embodiment, the robot according to the invention can comprise a guard volume, or guard walls, arranged around at least one, in particular each, electrical component part, and polarized at the guard potential ($V_G$), at the working frequency.

According to an embodiment, the robot according to the invention can also comprise at least one electrical converter arranged for:
- receiving at least one electrical signal, called input electrical signal, such as a power supply or control signal, intended for said electrical component part, and referencing said input signal to the guard potential; and/or
- receiving at least one electrical signal, called output electrical signal, transmitted by said electrical component part, and referencing said output signal to the electrical ground potential of a controller for which it is intended.

Thus, the electrical component part is generally referenced to the guard potential and thus does not interfere with the capacitive detection.

This embodiment has the advantage of being less bulky, less costly and easier to implement, as it does not require modification of the functional head, or a change to its design.

The converter can be arranged in order to thus receive input signals referenced to the general ground potential and convert them at the output to signals referenced to the guard potential, and vice versa.

It should be noted that insofar as the detection of the capacitive coupling is carried out at a working frequency, the electrical input/output signals relating to the electrical component parts of the functional head do not interfere with the measurement of the coupling capacitance, as they are rejected or filtered by the capacitive detection electronics. This is even more effective in the case of a synchronous demodulation of the signal measured by the detection electronics.

For the same reasons, if the potential of the sensitive part of the functional head used as electrode differs from the potential of the guard by the presence of continuous components or frequencies different from the working frequency, this does not create significant interferences with the measurements.

Such a converter can comprise at least one of the following elements:
- at least one power supply with galvanic isolation such as a DC/DC converter, in particular to generate a power supply input signal for at least one electrical component part;
- at least one electrical interface without galvanic contact, of the capacitive type or by optocoupler, for at least one control input signal, or at least one output signal;
- one or more inductors with high impedance to receive and transmit at least one input signal or at least one output signal: for example, this (these) inductor(s) can be wound on a common ferromagnetic core in order to further increase their impedance by mutual inductance effect.

According to an embodiment, the robot can comprise a guard produced by a layer of conductive material, in particular thin and flexible, in particular deposited on a part of said robot.

According to an embodiment, the robot can comprise a guard partially covering a sensitive part of the functional head. This makes it possible to limit the detection capacity of this sensitive part to its uncovered surfaces.

Alternatively, or in addition, the robot can comprise a guard produced by a metal part of the robot, arranged between the body and a sensitive part, electrically insulated on both sides, and polarized at the guard potential.

Thus, it is not necessary to add an additional element to the robot.

Alternatively, or in addition, the robot can comprise a guard produced by at least a part, or the totality, of the body of the robot according to the invention, polarized at the guard potential.

In fact, it is possible to polarize a significant part, or the totality, of the body of the robot at the guard potential. When the robot is a robotized arm, it is possible to polarize a significant part, or even the totality, of the arm at the guard potential and to use it as guard.

In this case, an electronic converter circuit, called interface circuit, is interfaced between the electrical circuit of this part of the robot polarized at the guard, and the electrical circuit of the rest of the robot referenced to the general ground. This interface circuit generates excitation of the capacitive electronics referenced to the guard, and provides the interface between the electronics of the part of the robot polarized at the guard, and the electronics of the rest of the robot referenced to ground (power supply, communication, etc.). This interface circuit can be housed at the level of the part of the robot referenced to the guard, or at the level of the part of the robot referenced to the ground potential.

When a part, or all of the robot, is covered with additional capacitive electrodes, and the part of the robot supporting these electrodes is referenced to the guard potential, the structure of the robot at the level of this part can thereby be simplified, as it is not necessary to intercalate an additional guard between the robot and these additional capacitive electrodes. These additional electrodes and the functional head can then be referenced to the same guard potential, which avoids any interference.

According to another embodiment, the robot can comprise a guard formed by a mounted part added to the robot.

Advantageously, such a part can be in the form of a sleeve extending along said robot over a non-zero distance, in particular in a direction away from, or opposite to, the sensitive part.

Such a form makes it possible to better guard the sensitive part of the functional head used as capacitive electrode, and thus improve the capacitive detection.

According to an advantageous characteristic, the robot according to the invention can comprise at least one additional capacitive sensor, arranged elsewhere than on a sensitive part.

In particular, the robot according to the invention can comprise an assembly of capacitive sensors, having the form of a capacitive skin, or a capacitive coating, integrated in, or mounted on, at least a part of the robot according to the invention, and in particular on the body of the robot.

In this case, the detection electronics can be at least partially in common with a detection electronics of said at least one additional capacitive sensor, in particular of the capacitive skin.

In addition, the at least one additional capacitive sensor can be polarized at an alternating potential identical to the first potential, at the working frequency.

Such a characteristic makes it possible to avoid any interference between the sensitive part of the functional head used as capacitive electrode and the additional sensors, and therefore to exploit these capacitive sensors as a guard.

Alternatively, the excitation potentials used for the sensitive part of the functional head and the additional capacitive sensors can be different at the working frequency, and in particular correspond to different working frequencies. In this case, the sensitive part of the tool can detect the other capacitive electrodes as an object coupled at, or at a potential close to, the general ground potential.

Similarly, a robot can comprise several functional heads (mounted for example on bodies in the form of separate arms firmly fixed on one and the same base), or several robots equipped respectively with one or more functional heads that can share one and the same space. Thus, these different functional heads can be used in a co-ordinated manner in order to carry out tasks.

The robot or robots can comprise functional heads with sensitive parts excited at one and the same excitation potential at a working frequency identical to the capacitive detection of all of these sensitive parts.

In this case the sensitive parts do not detect one another as each appears at the guard potential for the others.

The robot or robots can also comprise functional heads with sensitive parts excited at different excitation potentials, for capacitive detections at different working frequencies, or using excitation potentials orthogonal in the sense of the scalar product (thus with scalar product zero). In this case the respective sensitive parts detect the others like any other element at a ground potential for example.

These two configurations can be used statically or dynamically (by changing the excitation potentials of sensitive parts over time) as a function of the needs of the application.

The detection electronics can advantageously comprise a circuit comprising a current or charge amplifier. Such an amplifier can be produced by an operational amplifier and a feedback capacitance.

According to preferential embodiment modes, the detection electronics, and in particular the operational amplifier, can be supplied at a potential referenced to the guard potential.

According to other embodiment modes, the detection electronics can be supplied at a potential referenced to the general ground potential.

The detection electronics can also comprise a signal conditioner or conditioning means making it possible to obtain a signal representative of the sought electrode-object capacitance, and/or the presence or the proximity of an object.

This signal conditioner can comprise for example a synchronous demodulator for demodulating the signal with respect to a carrier wave, at a working frequency.

The signal conditioner can also comprise an asynchronous demodulator or an amplitude detector.

This signal conditioner can of course be produced in an analogue and/or digital form (microprocessor), and comprise all necessary means for filtering, conversion, processing etc.

The capacitive measurement signal, in particular the signals originating from the signal conditioner where necessary, can then be processed by software or a management module, which makes it possible to manage the detection of approach and contact, and in particular to exploit these items of information depending on the context of use of the robot.

Such software, or calculation module, can for example be integrated into a computer or a controller of the robot.

For example, when the functional head is in the process of gripping an object on a table, the detection can be deactivated so as not to inadvertently trigger a collision detection. On the other hand, when the robot displaces the object in order to convey it from a point A to a point B, the detection of approach can be activated in order to be able to detect an unexpected obstacle, and to move around it or perform an emergency stop or any other appropriate action.

In certain applications, the functional head can be used as an interaction control: contact with the functional head can for example trigger a slowing of the robot.

The threshold for triggering the detection of approach of an object or of contact can be parameterable in real time in order to take into account the environment which can influence the capacitance measured.

By way of example, the robot according to the invention can easily detect a human hand at a distance of more than 10 cm.

The functional head can comprise, or be formed by:
- a means for gripping an object, such as a gripper or a vice;
- a means for processing an object, such as a sander, a drill, a paint spray gun, etc.; and/or
- a means for inspecting an object, such as a camera, an interferometry head, etc.

The capacitive detection means, and in particular the polarization means, and/or the electrical insulator, and/or the guard and/or the detection electronics, can be arranged partially or totally within the body of the robot or in the functional head.

According to a non-limitative embodiment, the robot according to the invention can be any robotized system, and in particular a robotized arm.

The robot can also be or comprise for example a wheeled vehicle such as a truck equipped with an arm or a handling system, or a robot of the humanoid type, provided with movement component parts such as limbs.

According to another aspect of the invention, a device is proposed having the form of a tool, or a tool-holder, intended to form a functional head of a robot according to the invention, and comprising the capacitive detection means.

According to another aspect of the invention, a connection interface is proposed for a robot according to the invention, intended to be arranged between the functional head and the body of said robot, said connection interface comprising the capacitive detection means of said robot.

Such a connection interface makes it possible to use the functional head of a robot as a capacitive detection electrode without having to modify said functional head or the body of the robot. As a result, such a connection interface makes it possible to equip an existing robot, and/or functional heads or tools intended for an existing robot, with a capacitive detection functionality, simply and rapidly.

Such a connection interface can be articulated or not.
Such a connection interface can include:
- on the side of the functional head of the robot: at least one mechanical connector or a mechanical interface, and optionally at least one electrical connector similar to those provided on the body of the robot; and
- on the side of the body of the robot: at least one mechanical connector or a mechanical interface and optionally at least one electrical connector similar to those provided on the functional head of the robot.

BRIEF DESCRIPTION OF THE DRAWINGS

Other advantages and characteristics will become apparent on examination of the detailed description of non-limitative examples and from the attached drawings in which:

FIG. 1 is a diagrammatic representation of an example of a robot according to the prior art;

FIG. 2 is a diagrammatic representation of a non-limitative example of a robot according to the invention;

DETAILED DESCRIPTION

Figure 3:
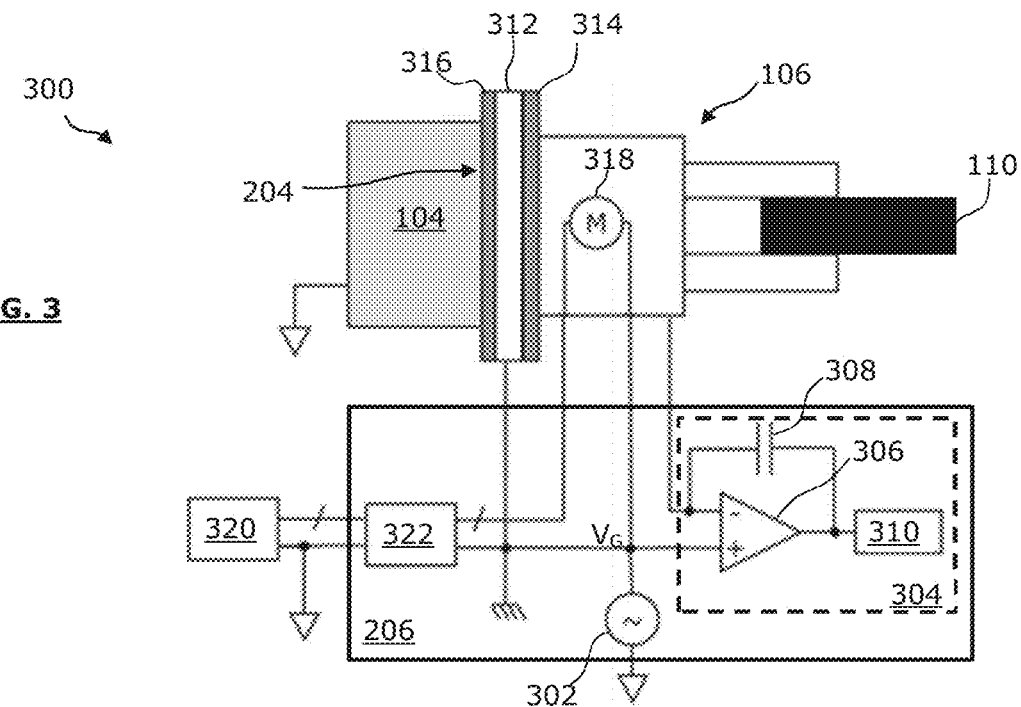
FIGS. 3-6 are partial diagrammatic representations of different embodiment examples of a robot according to the invention.

It is well understood that the embodiments that will be described hereinafter are in no way limitative. In particular, variants of the invention may be envisaged comprising only a selection of characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described may be combined together if there is no objection to such combination from a technical point of view.

In the figures, elements that are common to several figures retain the same reference.

FIG. 1 is a diagrammatic representation of an embodiment example of a robot according to the prior art.

The robot 100, shown in FIG. 1, has the form of an articulated robotized arm.

The robotized arm 100 can be for example an industrial collaborative robot working under the supervision of, or in collaboration with, an operator 102, or also a medical robot in the case of a surgical operation on the body of a person 102, or also a personal assistance robot 102.

The robotized arm 110 comprises a body 104 constituted by one or more articulated parts, and a functional head 106, mounted at the end of a robotized arm 104, by virtue of a mechanical interface 108, articulated or not. The functional head 106 is mounted on the body 104 in a detachable or removable manner in order to be interchangeable with other functional heads that are identical or different, fulfilling one and the same function or different functions.

In the example shown, the functional head 106 is a gripper for gripping, handling and moving objects from a point A to a point B. In FIG. 1, the robotized arm is shown with an object 110 held by the gripper 106.

FIG. 2 is a diagrammatic representation of a non-limitative embodiment of a robot according to the invention.

The robot 200 shown in FIG. 2, is a robotized arm such as that in FIG. 1. The robotized arm 200 comprises all the elements of the robotized arm 100 in FIG. 1.

In the robotized arm 200, the functional head 106 is used as a capacitive detection electrode in order to detect objects or the person 102 present in a detection zone 202 all around the functional head 106.

To this end, an interface 204 is arranged between the functional head 106 and the body 104 of the robotized arm 200. This interface 204 comprises:
- on the one hand an electrical insulator making it possible to electrically insulate the functional head 106 from the rest of the robotized arm 200; and
- on the other hand an electrical guard, insulated both from the functional head 106 and the body 104 of the robot 200, and polarized at an alternating electrical potential, called guard potential, different from a ground potential of the robotized arm 200, and in particular from the body 104 of the robotized arm, at a given working frequency.

Figure 4:
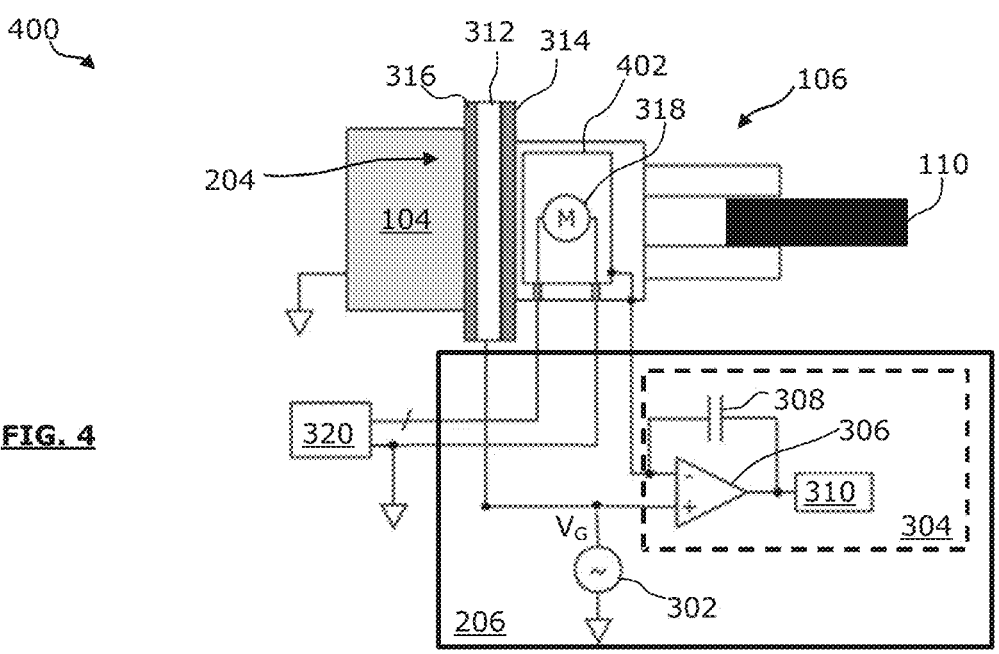
Figure 5:
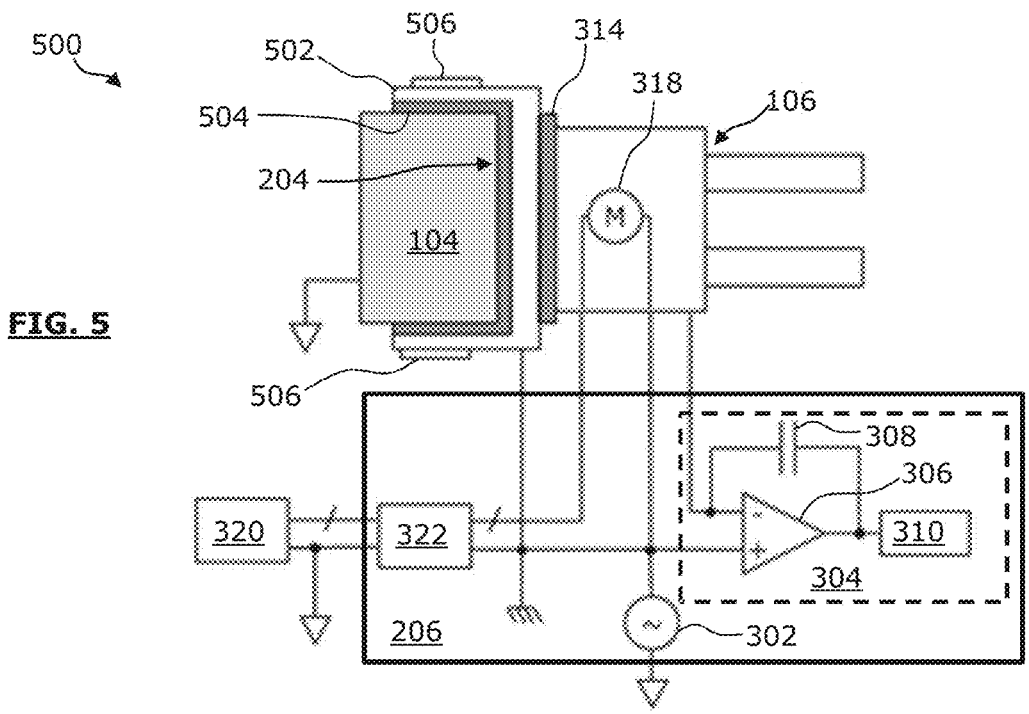

A first non-limitative embodiment example of the interface 204 is given in FIGS. 3 and 4, and a second non-limitative example of the interface is given in FIG. 5.

In addition, an electronic module 206 is provided in order to:
- polarize the functional head 106 at an alternating electrical potential identical or substantially identical to the guard potential at the working frequency; and
- measure an electrical signal, and in particular an electrical current, relating to a coupling capacitance, called electrode-object capacitance, and denoted $C_{eo}$, between the functional head 106 and its environment.

Non-limitative embodiment examples of such a module 206 are given in FIGS. 3 to 6.

FIG. 3 is a partial diagrammatic representation of another non-limitative embodiment example of a robot according to the invention.

The robotized arm 300, partially shown in FIG. 3, can be the robotized arm 200 in FIG. 2, and comprises all of the elements of the robotized arm 200.

In FIG. 3, only the end of the robotized arm 300 comprising the functional head 106 is shown.

In the example shown in FIG. 3, the electronic module 206 comprises an oscillator 302 which generates an alternating excitation voltage, denoted $V_G$, used to polarize the functional head 106 acting as detection electrode, and also used as guard potential.

The electronic module 206 also comprises a detection electronics 304 composed of a current or charge amplifier, represented by an operational amplifier 306 and a feedback capacitance 308.

The detection electronics 304 also comprises a signal conditioner 310 making it possible to obtain a signal representative of the sought coupling capacitance $C_{eo}$, and/or of the presence or the proximity of an object of a body. This signal conditioner 310 can comprise for example a synchronous demodulator for demodulating the signal with respect to a carrier wave, at a working frequency. The signal conditioner 310 can also comprise an asynchronous demodulator or an amplitude detector. This signal conditioner 310 can of course be produced in an analogue and/or digital form (microprocessor), and comprise all necessary means for filtering, conversion, processing etc.

In the configuration shown in FIG. 3, the functional head 106 is polarized via the operational amplifier 306. In particular, the oscillator 302 is connected to the positive input of the operational amplifier 306 and the functional head is connected to the negative input of the operational amplifier 306.

In the robotized arm, the interface 204 is arranged between the functional head 106 polarized at the guard potential $V_G$, and the body 104 polarized at the general ground potential. In the example shown in FIG. 3, the interface comprises a guard plane 312, for example formed by a metal part, polarized at the guard potential $V_G$ by the voltage provided by the oscillator 302.

The guard plane 312 is electrically insulated from the functional head 106 by a first electrical insulator element 314, and from the body 104 of the robotized arm 300 by a second electrical insulator 316.

Thus, the guard plane 312 makes it possible to electrically guard the functional head and to increase its detection sensitivity. In addition, the guard plane 312 makes it possible to avoid an inadvertent detection of the body 104 of the robotized arm by the functional head.

In the majority of cases, the functional head 106 can be equipped with one or more electrical component parts such as one or more sensors, or one or more motors or actuators.

In the example shown in FIG. 3, the functional head 106 is equipped with an electric motor 318. This electric motor 318 is supplied and controlled by a controller 320 of the robotized arm, dedicated or not to said motor 318 and referenced to the ground potential of the robotized arm, or of an electronics of the robotized arm, different from the guard potential $V_G$.

Without precautionary measures, such an electric motor 318 could trigger an inadvertent detection of the part of the functional head 106 used as capacitive electrode, due to the presence of a ground potential.

In order to avoid this, the electronic module 206 comprises a converter 322 arranged between the controller 320 and the motor 318 and having the function of:
- receiving at least one electrical signal, called input electrical signal, such as a power supply or control signal, transmitted by the controller 320 and intended for the motor 318, and referencing said input signal to the guard potential $V_G$; and
- receiving at least one electrical signal, called output electrical signal, transmitted by said motor 318, and intended for the controller 320, and referencing said output signal to the electrical ground potential of the controller.

Thus the motor 318, as well as the connectors and the electronics which are associated therewith are supplied by signals referenced to the guard potential $V_G$ and do not interfere with the capacitive detection electrode constituted by the functional head 106.

FIG. 4 is a partial diagrammatic representation of another non-limitative embodiment example of a robot according to the invention.

The robotized arm 400 partially shown in FIG. 4 can be the robotized arm 200 in FIG. 2. In FIG. 4, only the end of the robotized arm 400 comprising the functional head 106 is visible.

The robotized arm 400 shown in FIG. 4 comprises all of the elements of the robotized arm 300 in FIG. 3, except the potential converter 322. In fact, in the robotized arm 400, the motor 318 is connected to the controller 320 without using a potential converter.

Unlike the robotized arm 300, in the robotized arm 400, in order to avoid the functional head 106, when used as a capacitive detection electrode, detecting the motor 318 as well at its electronics and its electric wires, the latter are arranged in a housing 402, called guard housing, polarized at the guard potential. Thus the motor 318 as well as its electronics and its electric wires are not detected by the functional head 106.

FIG. 5 is a partial diagrammatic representation of another non-limitative embodiment example of a robot according to the invention.

The robotized arm 500 partially shown in FIG. 4 can be the robotized arm 200 in FIG. 2. In FIG. 5, only the end of the robotized arm 500 comprising the functional head 106 is shown.

The robotized robot arm 500 shown in FIG. 5 comprises all the elements of the robotized arm 300 in FIG. 3.

Unlike the robotized arm 300, the robotized arm 500 comprises a guard 502 having the form of a sleeve arranged on the body 104 and extending over the body 104 opposite the functional head 106. Thus, the functional head 106 is electrically better guarded with respect to the body 104 of the robotized arm 500.

The robotized arm 500 comprises a second electrical insulator 504 between the guard 502 and the body 104, also in the form of a sleeve arranged between the guard 104 and the body 104 and extending over the body 104 opposite the functional head 106.

Regardless of the embodiment example, the robotized arm can comprise additional capacitive electrodes, in addition to the functional head 106 used as a capacitive detection electrode. The robot 500 in FIG. 5 comprises for example such capacitive electrodes, referenced 506 and arranged on the guard 502 with an intercalated insulating layer.

Preferentially, these additional capacitive electrodes can be managed by the same electronics as that used for the capacitive head 106 and/or use the same alternating potential, at the working frequency. Alternatively, these additional capacitive electrodes can be managed by a separate electrode, and/or use a different alternating potential.

These additional capacitive electrodes can have the form of a capacitive skin arranged on the body 104 of the robotized arm in a removable or detachable manner, or integrated in the outer layer of the body 104 of the robotized arm.

Figure 6:
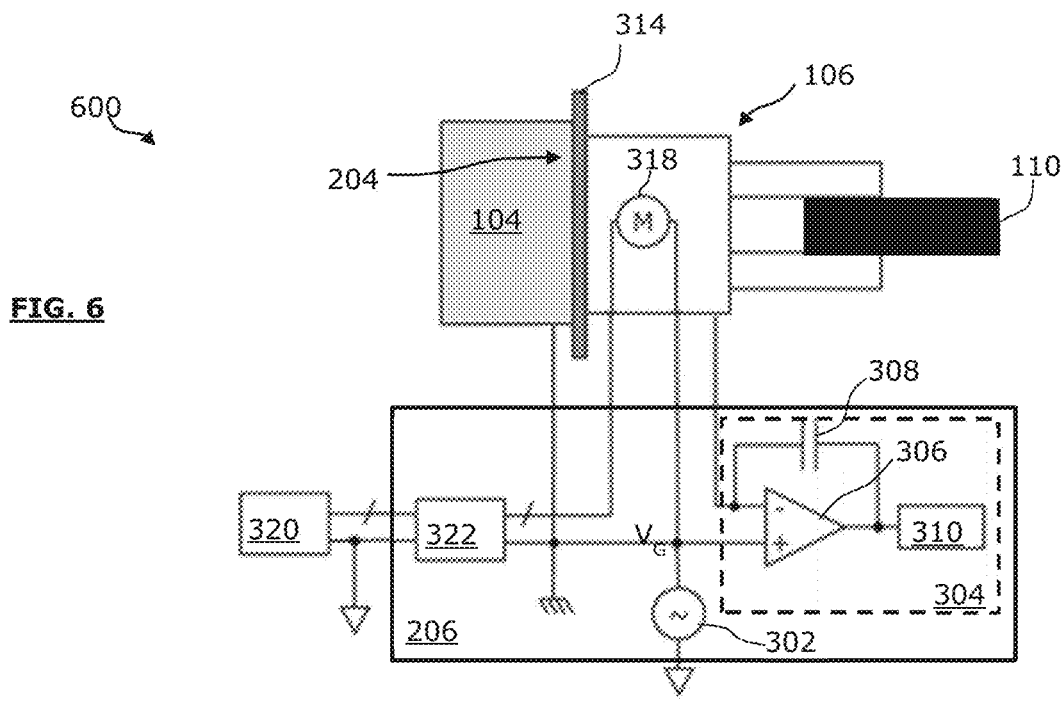

FIG. 6 is a partial diagrammatic representation of another non-limitative embodiment example of a robot according to the invention.

The robotized arm 600 partially shown in FIG. 6 can be the robotized arm 200 in FIG. 2. In FIG. 6, only the end of the robotized arm 600 comprising the functional head 106 is shown.

The robotized arm 600 shown in FIG. 5 comprises all the elements of the robotized arm 300 in FIG. 3, except the guard element 312 and the second insulating element 316.

In fact, unlike the robotized arm 300, in the robotized arm 600, the guard is produced by a part or the totality of the body 104 of the robotized arm. This part, or the totality, of the body 104 producing the guard is polarized at the guard potential $V_G$.

In this case, and in order to avoid any interference between the body 104 (or the part of the body 104) polarized at the guard potential $V_G$ and the electronics of the robotized arm 600 referenced to the general ground potential, a potential converter is used, such as for example the potential converter 322. This potential converter 322 has the purpose of referencing the signals going to electrical component parts arranged in the body 104 at the guard potential, and the signals originating from these electrical component parts and going to the controller 320, to the general ground potential.

As before, the robotized arm can comprise additional capacitive electrodes, arranged on the body 104. These additional capacitive electrodes can have the form of a capacitive skin arranged on the body 104 of the robotized arm in a removable or detachable manner, or integrated in the outer layer of the body 104 of the robotized arm. In this embodiment, it is not necessary to intercalate a guard between the body 104 of the robot and these additional capacitive electrodes.

The connection interface 204 can form an integral part of the functional head 106 or of the body of the robot 104. It can also be produced in the form of a separate element.

Figure 7:
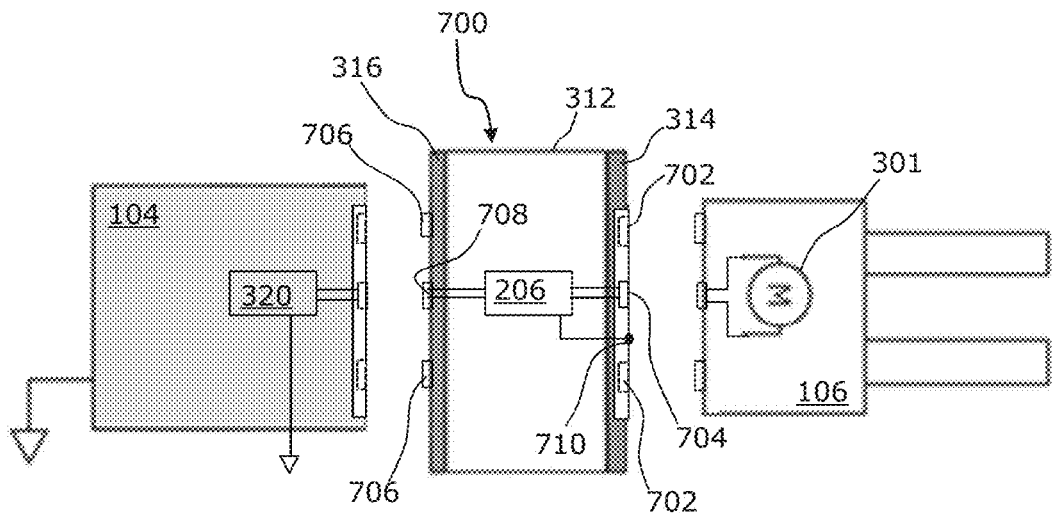
FIGS. 7 and 8 are diagrammatic representations of two non-limitative embodiment examples of a connection interface according to the invention.

FIG. 7 is a diagrammatic representation of a non-limitative example of a connection interface according to the invention in the form of a part separate from the functional head 106 or from the body of the robot 104.

The connection interface 700, shown in FIG. 7, can be the connection interface 204 of the robot 200 in FIG. 2.

The connection interface 700 is shown in FIG. 7 in a configuration disconnected from the functional head 106 and from the body 104.

The connection interface 700 is arranged between the functional head 106 and the body 104. It can be an additional interface which does not exist on the original robot, or replace an existing interface on the original robot. The connection interface 700 comprises capacitive detection means, namely the electronic module 206, the guard 312 as well as the insulating elements 314 and 316.

In the embodiment shown, the interface 700 includes:
- on the side of the functional head 106, a mechanical interface or mechanical connectors 702 and an electrical connector 704, identical to those present on the body 104, in order to provide a mechanical and electrical connection with the functional head 106; and
- on the side of the body 104, a mechanical interface or mechanical connectors 706 and an electrical connector 708, identical to those present on the functional head 106, in order to provide a mechanical and electrical connection with the body of the tool.

In addition, the interfaces or mechanical connectors 702 are complementary with the interfaces or the mechanical connectors 706 and the electrical connector 704 is complementary with the electrical connector 708.

Moreover, the connection interface 700 comprises, on the side of the functional head 106, an electrical contact 710 in order to polarize the functional head at an alternating electrical potential identical or substantially identical to the guard potential, at the working frequency.

Of course, a similar connection interface can be used in the case where a part or the totality of the body 104 of the robot is used as a guard, such as for example in the robot 600 in FIG. 6.

Figure 8:
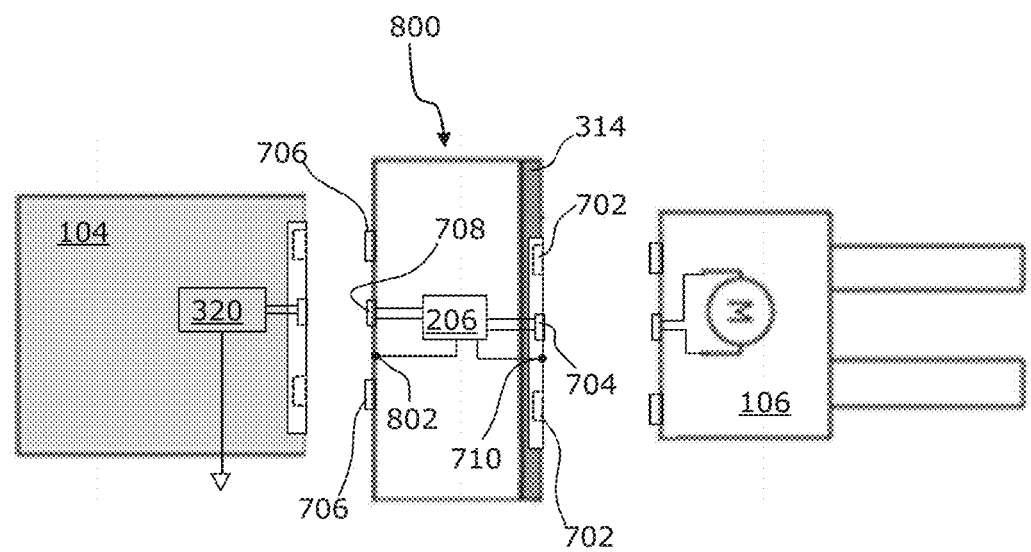

FIG. 8 is a diagrammatic representation of a non-limitative embodiment example of such a connection interface, in a disconnected configuration.

The connection interface 800, shown in FIG. 8, comprises all the elements of the connection interface 700 in FIG. 7, except the insulating element 316.

In addition, the connection interface 800 comprises, on the side of the body 104 an electrical contact 802, in order to polarize the body 104 at the guard potential.

Of course, the electronic module 206 can comprise components other than those described.

In addition, the electronic module 206 can be at least partially integrated in an electronics of the robot, or in the body of the robot, or in the functional head, or also in an existing or additional interface, positioned between the functional head and the body of the robot.

The electronic module 206 can also have the form of a module or a casing external to the body of the robot, and/or, in the embodiments in FIGS. 7 and 8, external to the connection interface 700 or 800. In this case, all or part of the electrical connections described can be located at the level of the electronic modules 206 connected to the other elements by cables.

Of course, the invention is not limited to the examples which have just been described and numerous adjustments can be made to these examples without exceeding the scope of the invention.

The invention claimed is:

1. A robot including a body and a functional head removably mounted on the body, where the functional head forms a tool, or a tool-holder, the robot also comprising capacitive detection means comprising:
   a sensitive part configured as the functional head, wherein the functional head acts as a capacitive detection electrode that detects an object or person in a detection zone around the functional head;
      at least one electrical insulator to electrically insulate the sensitive part of said functional head from the rest of the robot;
      at least one means for electrically polarizing said sensitive part by a first alternating electrical potential ($V_g$), different from a ground potential;
      a guard that is polarized at a second alternating potential ($V_G$), where the second alternating potential ($V_G$) is identical or substantially identical to the first alternating electrical potential ($V_G$) at a given working frequency, to electrically guard said sensitive part; and
      detection electronics configured for measuring a signal relating to a coupling capacitance between said sensitive part and a surrounding object.

2. The robot according to claim 1, further comprising a mechanical interface, articulated or not, between the functional head and the body, with an electrical insulator, and the guard arranged between the functional head and the body at the level of said interface.

3. The robot according to claim 1, wherein the functional head comprises at least one electrical component part, and further comprising a guard volume or guard walls, arranged around said at least one electrical component part, and polarized at the guard potential ($V_G$) at the working frequency.

4. The robot according to claim 1, wherein the functional head comprises at least one electrical component part, and further comprising at least one electrical converter arranged for:
   receiving at least one electrical signal, called input electrical signal, such as a power supply or control signal, intended for said electrical component part, and referencing said input signal to the guard potential ($V_G$); and/or
   receiving at least one electrical signal, called output electrical signal, transmitted by said electrical component part, and referencing said output signal to the electrical ground potential of a controller for which it is intended.

5. The robot according to claim 4, wherein the converter comprises:
   at least one power supply with galvanic isolation such as a DC/DC converter, in particular to generate an input power supply signal for said at least one electrical component part;
   at least one electrical interface without galvanic contact, of the capacitive type or by optocoupler, for at least one control input signal, or at least one output signal; and/or
   one or more inductors having high impedance to receive and transmit at least one input signal or at least one output signal.

6. The robot according to claim 1, further comprising a guard produced by a layer of conductive material.

7. The robot according to claim 1, further comprising a guard produced by a metal part of the robot, arranged between the body and the sensitive part of the functional head, electrically insulated on both sides, and polarized at the guard potential ($V_G$).

8. The robot according to claim 1, wherein the guard partially covers the sensitive part of the functional head.

9. The robot according to claim 1, wherein the guard produced by at least a part, or the totality, of the body of the robot, is polarized at the guard potential ($V_G$).

10. The robot according to claim 1, wherein the guard is formed by a mounted part in a form of a sleeve extending along the robot over a non-zero distance and in a direction away from, or opposite to, the sensitive part of the functional head.

11. The robot according to claim 1, further comprising at least one additional capacitive sensor arranged other than on the sensitive part of the functional head, the detection electronics being, at least partially, in common with a detection electronics of said at least one additional capacitive sensor.

12. The robot according to claim 11, wherein the at least one additional capacitive sensor is polarized at an alternating potential identical to the first potential, at the working frequency.

13. The robot according to claim 1, wherein the functional head comprises at least one of:
   a means for gripping an object;
   a means for processing an object; and
   a means for inspecting an object.

14. The robot according to claim 1, wherein the robot has the form of a robotized arm.

15. A device having the form of a tool, or a tool-holder, intended to form a functional head of a robot according to claim 1, and comprising the capacitive detection means of the robot.

16. A connection interface for a robot according to claim 1, intended to be arranged between the functional head and the body of the robot, said connection interface comprising the capacitive detection means of the robot.

* * * * *